(12) United States Patent
Puri et al.

(10) Patent No.: US 7,076,699 B1
(45) Date of Patent: Jul. 11, 2006

(54) METHOD FOR TESTING SEMICONDUCTOR DEVICES HAVING BUILT-IN SELF REPAIR (BISR) MEMORY

(75) Inventors: Mukesh K. Puri, Fremont, CA (US); Ghasi R. Agrawal, San Jose, CA (US); William Schwarz, Austin, TX (US)

(73) Assignee: LSI Logic Corporation, Milpitas, CA (US)

( * ) Notice: Subject to any disclaimer, the term of this patent is extended or adjusted under 35 U.S.C. 154(b) by 381 days.

(21) Appl. No.: 09/956,302

(22) Filed: Sep. 19, 2001

(51) Int. Cl.
*G11C 29/00* (2006.01)

(52) U.S. Cl. .................................................. 714/710
(58) Field of Classification Search ................ 714/710, 714/711, 715, 718, 719, 723, 724, 733, 734; 29/830; 438/415, 418
See application file for complete search history.

(56) References Cited

U.S. PATENT DOCUMENTS

| | | | |
|---|---|---|---|
| 5,490,324 A * | 2/1996 | Newman ..................... | 29/830 |
| 5,504,369 A | 4/1996 | Dasse et al. | |
| 5,903,500 A * | 5/1999 | Tsang et al. ........... | 365/189.05 |
| 5,929,650 A | 7/1999 | Pappert et al. | |
| 6,067,262 A * | 5/2000 | Irrinki et al. ............... | 365/201 |
| 6,725,403 B1 * | 4/2004 | Schmoelz .................... | 714/723 |

* cited by examiner

*Primary Examiner*—Albert Decady
*Assistant Examiner*—James C. Kerveros
(74) *Attorney, Agent, or Firm*—Maginot, Moore & Beck LLC

(57) ABSTRACT

A method for testing semiconductor devices advantageously increases manufacturing yields. The method includes generating memory repair data for a wafer die by writing at least one predetermined digital bit pattern into a memory on the wafer die, reading the at least one predetermined digital bit pattern back out of the memory, comparing the at least one predetermined digital bit pattern read out from the memory against the at least one predetermined digital bit pattern written into the memory, and storing results of the comparison as the memory repair data. The writing and reading are performed a plurality of times, each time with a different voltage and clock frequency combination being applied to the wafer die. The memory repair data is programmed into the wafer die, and the wafer die is assembled into a packaged semiconductor device. The packaged semiconductor device is tested by causing the memory repair data programmed within the packaged semiconductor device to be transferred into the memory a plurality of times, each time with a different voltage and clock frequency combination being applied to the packaged semiconductor device.

18 Claims, 5 Drawing Sheets

METHOD FOR TESTING SEMICONDUCTOR DEVICES HAVING BUILT-IN SELF REPAIR (BISR) MEMORY

BACKGROUND OF THE INVENTION

1. Field of the Invention

The present invention generally relates to semiconductor memory devices, and more particularly, to a process suitable for testing semiconductor devices having built-in self repair (BISR) memory.

2. Background Information

Integrated circuits have become key components of many consumer and commercial electronic products, often replacing discrete components and enhancing functionality. The semiconductor processing technologies that produce these integrated circuits have advanced to the point where complete systems, including memories, can be reduced to a single integrated circuit or application specific integrated circuit (ASIC) device. It is a common practice for the manufacturers of such integrated circuits to thoroughly test device functionality at the manufacturing site. Because of the increasing complexity of new designs, test development costs can account for a large percentage of the total ASIC development cost.

Before integrated circuits (or "chips") are released for shipment by a manufacturer, the devices typically undergo a variety of testing procedures. In ASIC devices incorporating integrated memories, for example, specific tests are carried out to verify that each of the memory cells within the integrated memory array(s) is functioning properly. This testing is necessary because perfect yields are difficult to achieve. It is not uncommon for a certain percentage of unpackaged ASIC die to contain memory cells which fail testing processes, due largely to non-systemic manufacturing defects and degradation faults. Such manufacturing issues are likely to increase as process geometries continue to shrink and the density of memory cells increases.

A number of memory testing strategies have evolved. If an embedded memory is buried deeply within an ASIC, a built-in self-test (BIST) is often used by semiconductor vendors. BIST refers in general to any test technique in which test vectors are generated internal to an integrated circuit or ASIC. Test vectors are sequences of signals that are applied to integrated circuitry to determine if the integrated circuitry is performing as designed. BIST can be used to test memories located anywhere on the ASIC without requiring dedicated input/output pins, and can be used to test memory or logic circuitry every time power is applied to the ASIC, thereby allowing an ASIC to be easily tested after it has been incorporated in an end product. Further, since BIST structures remain active on a device, BIST can be employed at the board or system level to yield reduced system testing costs, and to reduce field diagnosis and repair costs. A number of software tools are available for automatically generating BIST circuitry, including RAMBIST Builder by LSI Logic of Milpitas, Calif.

In addition to the aforementioned testing procedures, manufacturers utilize a number of techniques to repair faulty memories when feasible. Such techniques include bypassing faulty cells using laser procedures and fused links that cause address redirection. In order to enhance the repair process, on-chip built-in self repair (BISR) circuitry for repairing faulty memory cells has evolved. BISR circuitry functions internal to the integrated circuit without detailed interaction with external test or repair equipment. In the BISR approach, suitable test algorithms are preferably developed and implemented in BIST or BIST-like circuitry. These test patterns may be capable of detecting stuck-at, stuck-open, and bridging faults during memory column tests, as well as memory cell faults and retention faults during memory tests.

Following execution of the test patterns, the BISR circuitry analyzes the BIST results and, in the event of detected faults, automatically reconfigures the faulty memory utilizing redundant memory elements to replace the faulty ones. A memory incorporating BISR is therefore defect-tolerant. The assignee of the present invention, LSI Logic Corporation, has addressed different methods of repairing faulty memory locations utilizing BIST and BISR circuitry.

While the process of testing and repairing semiconductor memories through BIST and BISR is generally known and practiced in the semiconductor industry, there still exists a need to increase manufacturing yields. In particular, there exists a need for an improved method of testing semiconductor devices, wherein the memories included on such devices are tested under a wide range of operating conditions. Moreover, such testing should be performed both before and after a semiconductor device is assembled into its final packaged form. The present invention addresses these and other issues.

SUMMARY OF THE INVENTION

In accordance with principles of the present invention, a method for testing a semiconductor device is disclosed. The method includes generating memory repair data for a wafer die by writing at least one predetermined digital bit pattern into a memory on the wafer die, reading the at least one predetermined digital bit pattern back out of the memory, comparing the at least one predetermined digital bit pattern read out from the memory against the at least one predetermined digital bit pattern written into the memory, and storing results of the comparison as the memory repair data. The writing and reading are performed a plurality of times, each time with a different voltage and clock frequency combination being applied to the circuit on the wafer die. The memory repair data is programmed into the wafer die, and the wafer die is assembled into a packaged semiconductor device. The packaged semiconductor device is tested by causing the memory repair data programmed within the packaged semiconductor device to be transferred into the memory a plurality of times, each time with a different voltage and clock frequency combination being applied to the packaged semiconductor device. According to an exemplary embodiment, the memory repair data is programmed into the wafer die by blowing one or more fuses on the wafer die corresponding to the memory repair data, and the wafer die is assembled into the packaged semiconductor device by applying to the wafer die an exterior coating comprised of an epoxy or ceramic material. A semiconductor device tested by the foregoing method is also disclosed.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying is drawings, wherein.

The exemplifications set out herein illustrate preferred embodiments of the invention, and such exemplifications are not to be construed as limiting the scope of the invention in any manner.

DETAILED DESCRIPTION OF THE INVENTION

Figure 1:
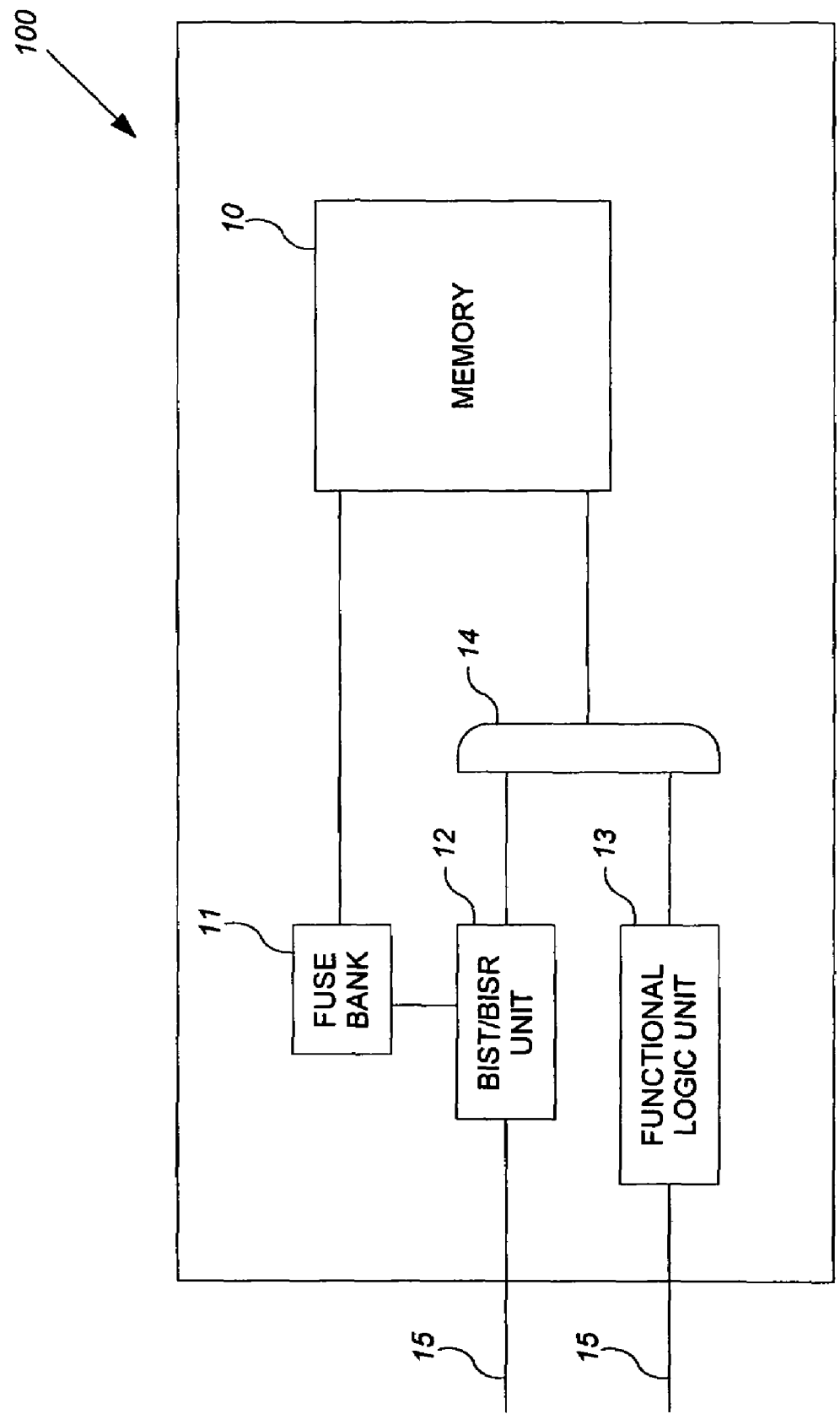
FIG. 1 is a schematic diagram of an exemplary semiconductor device having BISR memory.

Referring now to the drawings, and more particularly to FIG. 1, a schematic diagram of an exemplary semiconductor device 100 having BISR memory is shown. In FIG. 1, the semiconductor device 100 comprises a memory 10, a fuse bank 11, a BIST/BISR unit 12, a functional logic unit 13, a multiplexer 14, and input/output terminals 15. For purposes of simplicity, the semiconductor device 100 of FIG. 1 is shown as having only one memory. However, in practice it is contemplated that the semiconductor device 100 may include a plurality of such memories, and other components including some not shown in FIG. 1. Also, the semiconductor device 100 is represented in FIG. 1 in an assembled and packaged form. Prior to assembly and packaging, however, the semiconductor device 100 is embodied as a wafer die that includes the components shown in FIG. 1. Accordingly, reference herein to a "wafer die" or simply "die" refers to a semiconductor device prior to its assembly into a packaged semiconductor device, such as the one shown in FIG. 1.

In FIG. 1, the memory 10 comprises a plurality of memory cells for storing digital data. These memory cells are typically arranged in rows and columns. According to an exemplary embodiment, the memory 10 is a static random access memory (SRAM), although the principles of the present invention may also be applied to other types of memories such as a dynamic random access memory (DRAM). In FIG. 1, it is assumed that some of the memory cells within the memory 10 are faulty or defective. The fuse bank 11 comprises a plurality of fuses which are opened (i.e., blown) in order to deselect rows or columns of memory cells in the memory 10 that are faulty. That is, a fuse corresponding to a particular row or column whose address is to be reconfigured is blown in order to bypass the normal path to that row or column when power is applied to the die 100. The process of blowing fuses to reconfigure memories is well known in the semiconductor industry.

The BIST/BISR unit 12 enables performance of testing and repair operations for the memory 10. Among other things, the BIST/BISR unit 12 writes one or more predetermined digital bit patterns to the memory 10 through the multiplexer 14, and reads the bit pattern(s) back out from the memory 10. The BIST/BISR unit 12 then compares the bit pattern(s) read out from the memory 10 against the bit pattern(s) written to the memory 10, and stores the results of the comparison as memory repair data. In particular, the BIST/BISR unit 12 stores digital data indicating the location of memory cells within the memory 10 that fail to provide an output identical to its input. In this manner, faulty memory cells within the memory 10 can be identified and repaired. The functional logic unit 13 performs logic and/or processing operations, and writes data into and reads data from the memory 10 through the multiplexer 14. The input/output terminals 15 enable the input and output of data to and from the BIST/BISR unit 12 and the functional logic unit 13.

Figure 2:
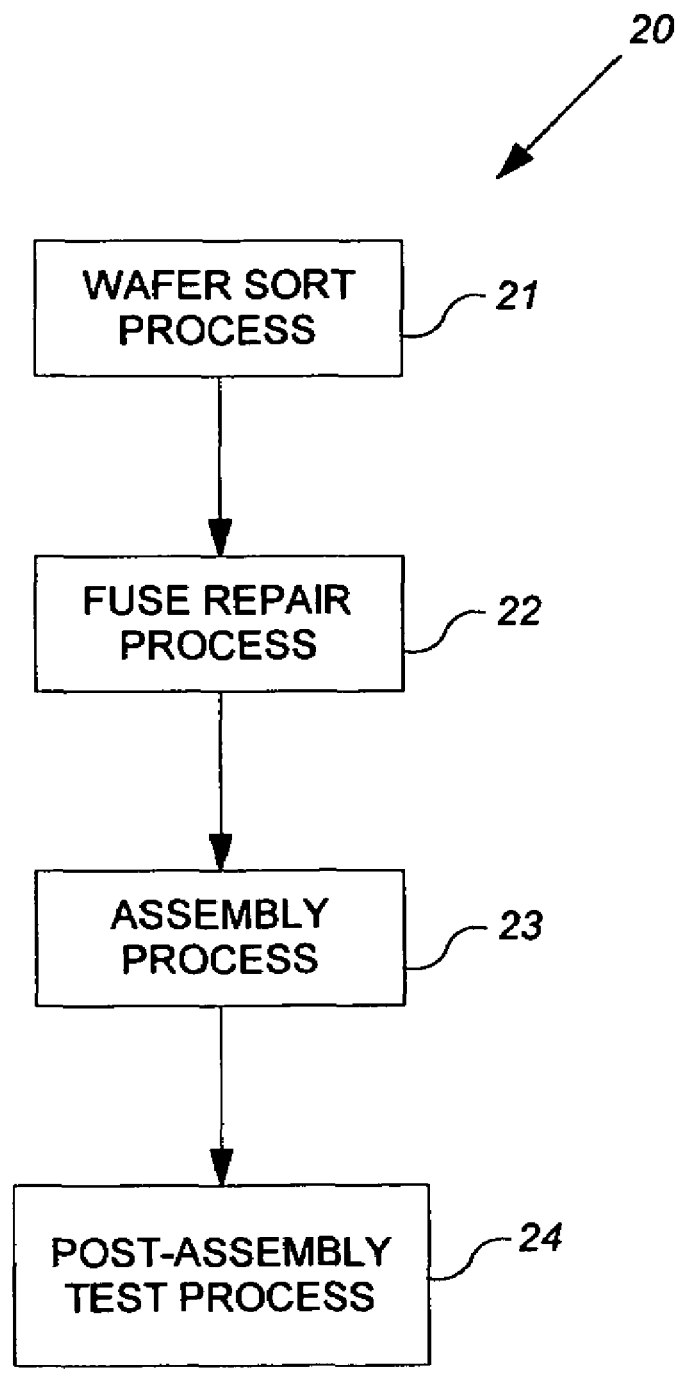
FIG. 2 is a flowchart illustrating a testing process for semiconductor devices having BISR memory according to principles of the present invention.

Referring to FIG. 2, a flowchart 20 illustrating a testing process for semiconductor devices having BISR memory according to principles of the present invention is shown. For purposes of explanation and example, the process of FIG. 2 will be described in relation to the exemplary semiconductor device 100 of FIG. 1, which in its unpackaged state is referred to as a wafer die, or simply a die. Moreover, the input voltages and clock frequencies referred to herein are suitable for testing semiconductors employing 0.18 micron technology, which refers to the gate size of the smallest transistor included on the semiconductor. Such semiconductors may utilize a voltage level of 1.80 volts to represent a binary high signal and use a clock frequency of 10 MHz under normal operating conditions. However, other input voltages and clock frequencies may be used in accordance with the principles of the present invention depending upon the type of semiconductor being tested.

In FIG. 2, the illustrated process begins at step 21 where a wafer sort process is performed. In general, the wafer sort process includes placing one or more wafer dies through a variety of functional tests. Each of these wafer dies is intended ultimately to be assembled into a packaged semiconductor device, such as the semiconductor device 100 of FIG. 1. Prior to this assembly, the wafer sort process is used to determine, among other things, which memory cells of the memory 10 are faulty (if any). The wafer sort process further includes generating repair data for the memory 10, which is ultimately programmed into the fuse bank 11 to avoid usage of the faulty memory cells. Further details regarding the wafer sort process of step 21 will provided later herein with reference to FIG. 3.

At step 22, a fuse repair process is performed. In particular, the fuse repair process of step 22 involves programming the memory repair data obtained at step 21 into the fuse bank 11 of an unassembled wafer die. In general, fuse repair is a process where one or more fuses are blown in order to deselect one or more rows or columns of memory cells that are faulty, and to substitute redundant rows or columns in place thereof. According to the principles of the present invention, a laser is used to blow these fuses. Further details regarding the fuse repair process of step 22 will provided later herein with reference to FIG. 4.

Next, at step 23, an assembly process is performed. The assembly process generally involves cutting a wafer into a plurality of individual wafer dies, and assembling each die into a package by applying to each die an exterior coating typically comprised of an epoxy or ceramic material. A packaged die, such as the semiconductor device 100 of FIG. 1, is often referred to as a "chip." This assembly process is well known in the semiconductor industry.

After the assembly process of step 23, a post-assembly test process is performed at step 24. When the post-assembly test process begins, each packaged die already has its final memory repair data programmed into the fuse bank 11 at step 22. Accordingly, the post-assembly test process of step 24 is used to, among other things, verify that the memory repair data generated during the wafer sort process of step 21 has been properly programmed into the fuse bank 11 during the fuse repair process of step 22. Further details regarding the post-assembly test process of step 24 will provided later herein with reference to FIG. 5.

Figure 3:
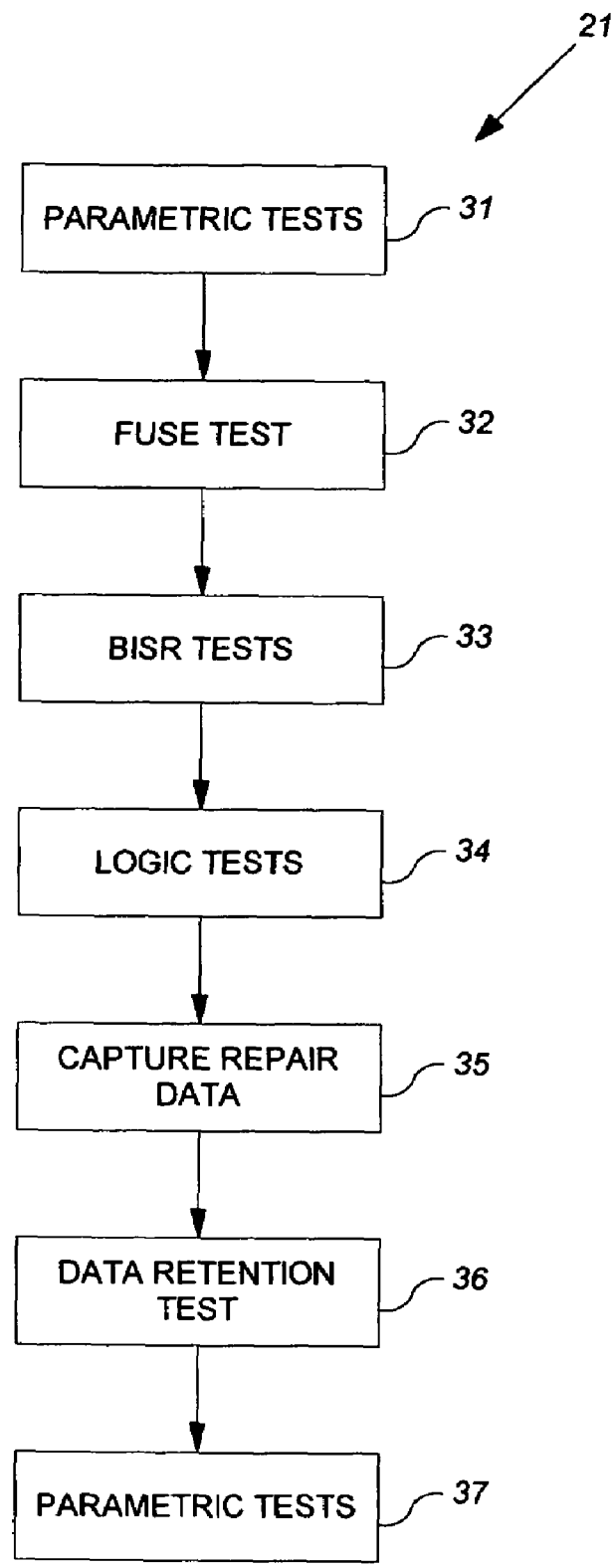
FIG. 3 is a flowchart illustrating details of a wafer sort process according to principles of the present invention.

Referring now to FIG. 3, a flowchart 21 illustrating details of a wafer sort process according to principles of the present invention is shown. That is, FIG. 3 illustrates details of the wafer sort process shown at step 21 in FIG. 2. According to an exemplary embodiment, the wafer sort process is performed on round silicon wafers, which are each approximately 8 inches in diameter. Each wafer includes a plurality of dies, and each die includes one or more memories.

At step 31 of FIG. 3, one or more broad level parametric tests are performed on each wafer die. Parametric tests are well known in the semiconductor industry and are used, for example, to measure the static analog characteristics and/or the dynamic parameters of each die's input/output terminals. Parametric tests may be performed, for example, to determine whether a die's connectors are operable, determine whether a die is drawing too much electrical current, etc. Accordingly, parametric tests are a useful way in which to quickly identify faulty wafer dies before further testing is performed.

At step 32, a fuse test is performed on each wafer die 100 to determine the state of its fuse bank(s) 11. In particular, the fuse test is performed by the BIST/BISR unit 12 inputting one or more predetermined digital bit patterns to the fuse bank 11 and reading the bit pattern(s) out to ensure that all of the fuses within the fuse bank 11 are in a connected, unblown state. According to an exemplary embodiment, the fuse test is performed using an input voltage and clock frequency of 1.62 volts and 10 MHz, respectively.

At step 33, a plurality of BISR tests are performed to identify the addresses of faulty memory cells within the memory 10. Each BISR test generally involves the BIST/BISR unit 12 writing one or more predetermined digital bit patterns to the memory 10 via the multiplexer 14, reading the bit pattern(s) back out from the memory 10, comparing the bit pattern(s) read out from the memory 10 against the bit pattern(s) written to the memory 10, and storing the results of the comparison as memory repair data. That is, as a result of the BISR tests, the BIST/BISR unit 12 stores digital data indicating the location of memory cells within the memory 10 that fail to provide an output identical to its input. In this manner, the addresses of faulty memory cells within the memory 10 can be identified, so that appropriate repairs may be made.

According to a preferred embodiment, three separate BISR tests are sequentially performed on the memory 10, and each test is conducted using a different input voltage and clock frequency combination. Performing BISR tests with varied voltage and clock frequency combinations input to the wafer die significantly increases the likelihood of detecting and repairing faulty memory cells. In particular, different voltage levels allow binary high signals to be represented by different voltage levels, and different frequencies allow the bit pattern(s) to be input to and read from the memory 10 at different bit rates. Accordingly, performing these tests with varied voltage and clock frequency combinations input to the wafer die is particularly advantageous since it allows the memory 10 to be tested under a wide range of operating conditions.

The first BISR test is preferably performed using an input voltage and clock frequency of 1.62 volts and 10 MHz, respectively. The second BISR test is preferably performed using an input voltage and clock frequency of 1.98 volts and 10 MHz, respectively. The third BISR test is preferably performed using an input voltage and clock frequency of 1.80 volts and 50 MHz, respectively. The bit patterns used during each of the BISR tests may be the same or varied. Data representative of failing memory cell addresses identified during the BISR tests is stored in the BIST/BISR unit 12 of the particular wafer die as memory repair data. That is, the BIST/BISR unit 12 stores digital data indicating the location (i.e., addresses) of memory cells within the memory 10 that fail to provide an output identical to its input during the BISR tests. After the BISR tests are performed, the data indicating the location of the failing memory cells is mapped into the memory 10 so that those memory cells are not written to. This data is also retained within the BIST/BISR unit 12.

Next, at step 34, the wafer sort process continues by performing various logic tests on each wafer die. Logic tests are commonly used in the semiconductor industry, for example, to ensure that each die's logic circuits, such as those within the functional logic unit 13, are operating properly. In general, a logic test is performed by applying one or more predetermined digital bit patterns to the logic circuits and reading out the results. Moreover, the present invention uses logic tests to ensure that the failing memory cells identified and stored during the BISR tests of step 33 do not get written to. According to an exemplary embodiment, four separate logic tests are sequentially performed on each wafer die. Like the BISR tests of step 33, the logic tests of step 34 are preferably performed using different input voltage and clock frequency combinations to the wafer die.

In particular, a first logic test is preferably performed with an input voltage and clock frequency of 1.62 volts and 10 MHz, respectively. A second logic test is preferably performed with an input voltage and clock frequency of 1.98 volts and 10 MHz, respectively. A third logic test is referred to as a scan test, which is commonly used in the semiconductor industry to thoroughly test the various scan chains on the wafer die. A fourth logic test is preferably performed with an input voltage and clock frequency of 1.80 volts and 50 MHz, respectively. According to principles of the present invention, it is advantageous to perform the BISR tests prior to performing logic tests since the results of the BISR tests can be confirmed during the logic tests. That is, the logic tests can be used to confirm that the failing memory cells identified and stored during the BISR tests do not get written to.

After the logic tests, the wafer sort process continues at step 35 where memory repair data is captured. According to an exemplary embodiment, memory repair data is captured by reading out from the BIST/BISR unit 12 the data representative of the failing memory cell addresses identified in the BISR tests of step 33. The data read from the BIST/BISR unit 12 represents the final repair data and is stored by an external testing device in an electronic datalog file. In addition to the repair data, the datalog file also includes for each die information identifying wafer lot, wafer, and the particular die. This information enables the final repair data to be correlated to the particular die during the fuse repair process. Since the memory repair data stored in the BIST/BISR unit 12 is volatile, power to the wafer die should be maintained at least until the repair is captured at step 35.

Next, at step 36, a data retention test is performed to ensure that the memory 10 is properly retaining stored data. In particular, the data retention test is used to detect any memory cell leakage which would adversely affect the memory's 10 ability to retain stored data. In general, the data retention test is performed by inputting a predetermined bit pattern to the memory 10, adjusting the input voltage levels to the wafer die, and detecting whether the memory 10 retains the predetermined bit pattern.

Then, at step 37, one or more parametric tests are again performed on each wafer die. As previously indicated, parametric tests are well known in the semiconductor industry and are used, for example, to measure the static analog characteristics and/or the dynamic parameters of each die's input/output terminals. Parametric tests may be performed, for example, to determine whether a die's connectors are operable, determine whether a die is drawing too much electrical current, etc. Accordingly, parametric tests are a useful way in which to quickly identify faulty wafer dies.

Figure 4:
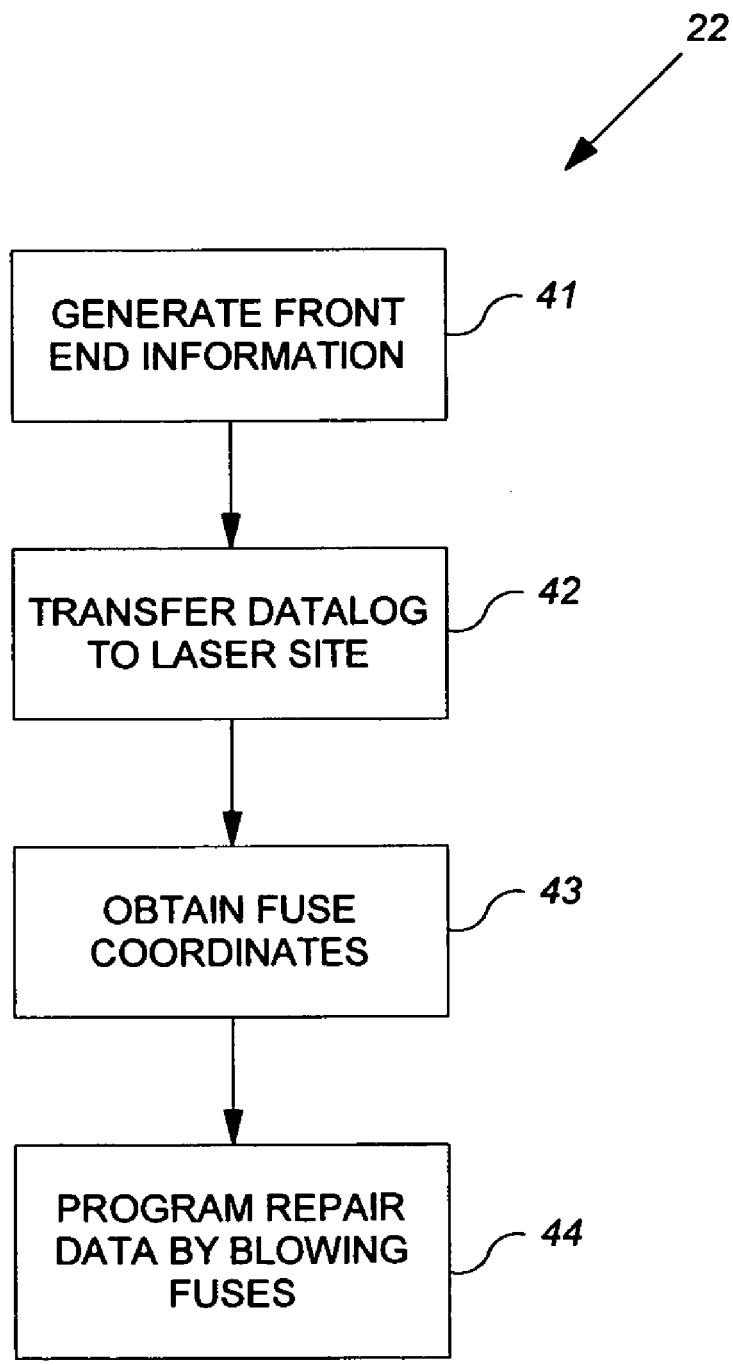
FIG. 4 is a flowchart illustrating details of a fuse repair process according to principles of the present invention.

Referring to FIG. 4, a flowchart 22 illustrating details of a fuse repair process according to principles of the present invention is shown. That is, FIG. 4 illustrates details of the fuse repair process shown at step 22 in FIG. 2. In general, the process of fuse repair is well known in the semiconductor industry.

At step 41 of FIG. 4, front-end information is generated to enable the fuse repair process. In particular, this front-end information includes alignment target coordinates (e.g., x-y coordinates) of each wafer die, physical fuse coordinates within each wafer die, and the sequence in which repair data was captured from the dies. At step 42, the datalog file generated during the wafer sort process is transferred to the site of a laser, which is used to blow fuses to lock in the final memory repair data. As previously indicated, the datalog file includes for each die the captured repair data as well as reference to wafer lot, wafer and the die. Next, at step 43, the front-end information and the datalog files are used to obtain a set of fuse coordinates to be used by the laser. Then, at step 44, the repair solution is programmed into the wafer die by blowing fuses corresponding to the fuse coordinates. The use of laser equipment to blow select fuses within semiconductor devices is well known to those of ordinary skill in the art.

After the fuse repair process, each wafer die is assembled into a packaged semiconductor device, such as the semiconductor device 100 represented in FIG. 1. As previously indicated, the process of assembling wafer dies into packaged semiconductor devices is well known in the semiconductor industry. After the assembly process, the post-assembly test process is performed.

Figure 5:
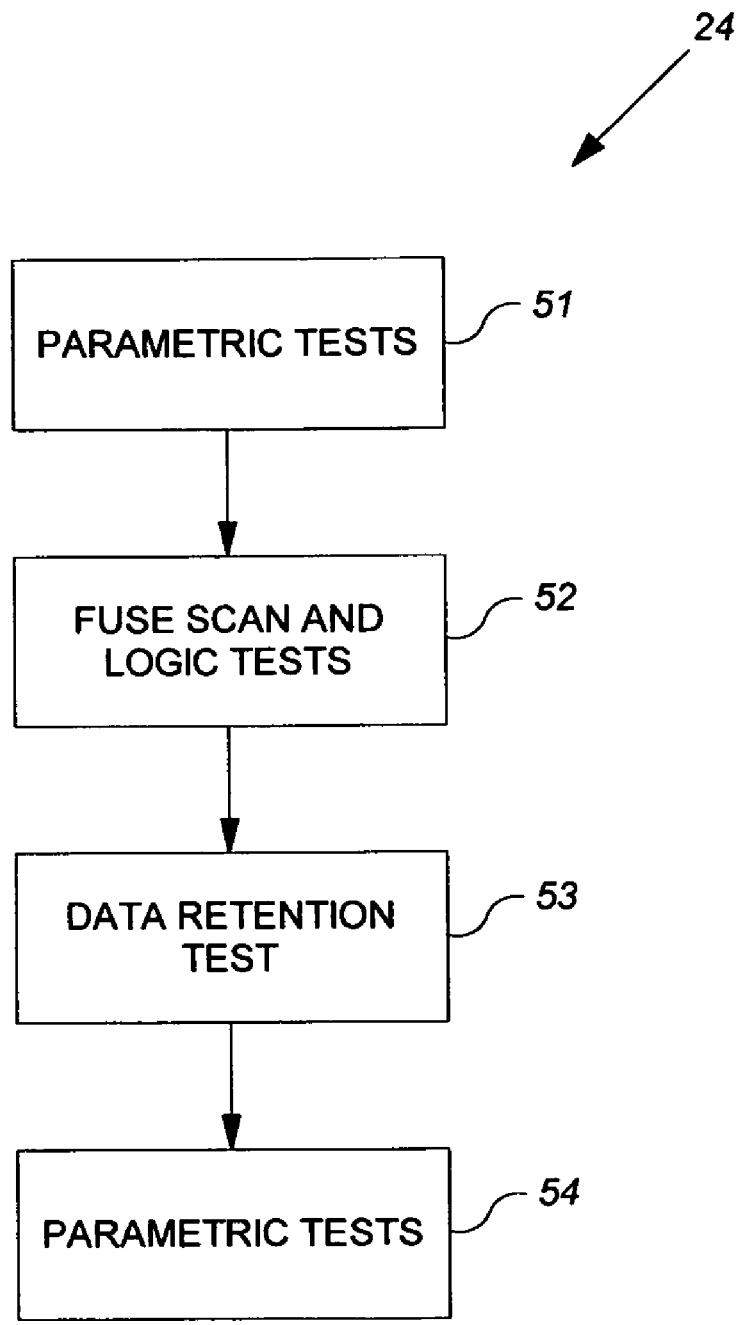
FIG. 5 is a flowchart illustrating details of a post-assembly test process according to principles of the present invention.

Referring to FIG. 5, a flowchart 24 illustrating details of a post-assembly test process according to principles of the present invention is shown. That is, FIG. 5 illustrates details of the post-assembly test process shown at step 24 in FIG. 2. When the post-assembly test process begins, the final repair data has already been programmed into each wafer die, and each die has been assembled into a packaged semiconductor device, such as the one represented in FIG. 1. Accordingly, there is no need to perform additional BISR tests during the post-assembly test process. However, additional memory tests are performed.

Like the wafer sort process, the post-assembly test process begins at step 51 by performing one or more broad level parametric tests. As previously indicated, parametric tests are well known in the semiconductor industry and are used, for example, to measure the static analog characteristics and/or the dynamic parameters of each device's input/output terminals. Parametric tests may be performed, for example, to determine whether a device's connectors are operable, determine whether a device is drawing too much electrical current, etc. Accordingly, parametric tests are a useful way in which to quickly identify faulty semiconductor devices.

Next, at step 52, a plurality of fuse scan and logic tests are performed on each packaged semiconductor device 100. In general, a fuse scan test is a process where the packaged semiconductor device 100 is powered up causing the repair data programmed into the fuse bank 11 to be transferred (i.e., scanned) into the memory 10. In this manner, the memory 10 thereby avoids writing to and reading from the faulty memory cells represented by the repair data. In particular, data directed to any of the faulty memory cells is remapped to redundant rows.

The logic tests of step 52 are essentially the same tests referred to at step 34 of the wafer sort process, and are commonly used in the semiconductor industry, for example, to ensure that each packaged device's logic circuits are operating properly. As previously indicated, logic tests are generally performed by applying one or more predetermined digital bit patterns to the logic circuits, including the functional logic unit 13 of the packaged semiconductor device 100, and reading out the results. Moreover, the present invention uses logic tests at step 52 to ensure that the failing memory cells represented by the memory repair data scanned into the memory 10 during the fuse scan test do not get written to. Accordingly, the fuse scan and logic tests operate together to ensure that the packaged semiconductor device 100 operates properly when powered up.

According to an exemplary embodiment, a plurality of separate fuse scan and logic tests are sequentially performed on each wafer die. That is, a fuse scan test is first performed, and then a corresponding logic test is performed. Like other tests of the present invention, the fuse scan and logic tests of step 52 are preferably performed using different input voltage and clock frequency combinations to the packaged semiconductor device 100.

According to an exemplary embodiment, a first fuse scan test is performed with an input voltage and clock frequency to the semiconductor device 100 of 1.62 volts and 10 MHz, respectively. After the first fuse scan test is performed, a first corresponding logic test is performed, also with an input voltage and clock frequency to the semiconductor device 100 of 1.62 volts and 10 MHz, respectively. Next, a second fuse scan test is performed with an input voltage and clock frequency to the semiconductor device 100 of 1.98 volts and 10 MHz, respectively. After the second fuse scan test is performed, a second corresponding logic test is performed, also with an input voltage and clock frequency to the semiconductor device 100 of 1.98 volts and 10 MHz, respectively. After the second logic test is performed, a scan test which is commonly used in the semiconductor industry to thoroughly test the various scan chains on the semiconductor device 100. Then, after the scan test is performed, a third fuse test is performed with an input voltage and clock frequency to the semiconductor device 100 of 1.80 volts and 50 MHz, respectively. After the third fuse scan test is performed, a third corresponding logic test is performed, also with an input voltage and clock frequency to the semiconductor device 100 of 1.80 volts and 50 MHz, respectively.

Performing the foregoing fuse scan and logic tests with varied input voltage and clock frequency combinations significantly increases the likelihood of detecting faulty memory cells in the packaged semiconductor device 100. In particular, different voltage levels allow binary high signals to be represented by different voltage levels, and different frequencies allow the bit pattern(s) to be input to and read from the memory 10 at different bit rates. Accordingly, performing these tests with varied voltage and clock frequency combinations input to the packaged semiconductor device 100 is particularly advantageous since it allows the memory 10 to be tested under a wide range of operating conditions.

At step 53, a data retention test is performed to ensure that the memory 10 is properly retaining stored data. In particular, the data retention test is used to detect any memory cell leakage which would adversely affect the memory's 10 ability to retain stored data. In general, the data retention test is performed by inputting a predetermined bit pattern to the memory 10, adjusting the input voltage levels to the wafer die, and detecting whether the memory 10 retains the predetermined bit pattern. Then, at step 54, one or more parametric tests are again performed on each semiconductor device 100. As previously indicated, parametric tests are a useful way in which to quickly identify faulty wafer dies.

While this invention has been described as having a preferred design, the present invention can be further modified within the spirit and scope of this disclosure. This application is therefore intended to cover any variations, uses, of adaptations of the invention using its general principles. Further, this application is intended to cover such departures from the present disclosure as come within known or customary practice in the art to which this invention pertains and which fall within the limits of the appended claims.

What is claimed is:

1. A method for testing semiconductor devices, comprising steps of:
   generating memory repair data for a wafer die by writing at least one predetermined digital bit pattern into a memory on the wafer die, reading the at least one predetermined digital bit pattern back out of the memory, comparing the at least one predetermined digital bit pattern read out from the memory against the at least one predetermined digital bit pattern written into the memory, and storing results of the comparison as the memory repair data, wherein the writing and reading are performed a plurality of times, each time with a different voltage and clock frequency combination being applied to the wafer die;
   permanently programming the memory repair data into the wafer die;
   assembling the wafer die into a packaged semiconductor device; and
   testing the packaged semiconductor device by causing the memory repair data programmed within the packaged semiconductor device to be transferred into the memory a plurality of times, each time with a different voltage and clock frequency combination being applied to the packaged semiconductor device.

2. The method of claim 1, wherein the memory repair data is programmed into the wafer die by blowing one or more fuses on the wafer die corresponding to the memory repair data.

3. The method of claim 1, wherein the wafer die is assembled into the packaged semiconductor device by applying to the wafer die an exterior coating comprised of an epoxy material.

4. The method of claim 1, wherein the wafer die is assembled into the packaged semiconductor device by applying to the wafer die an exterior coating comprised of a ceramic material.

5. The method of claim 1, wherein during the step of generating the memory repair data, the writing and reading is performed three times, a first time with a first voltage being applied to the wafer die, a second time with a second voltage being applied to the wafer die, and a third time with a third voltage being applied to the wafer die, wherein the first voltage is lower than the second and third voltages and the second voltage is higher than the first and third voltages.

6. The method of claim 1, wherein during the step of testing the packaged semiconductor device, the memory repair data programmed within the packaged semiconductor device is transferred into the memory three times, a first time with a first voltage being applied to the packaged semiconductor device, a second time with a second voltage being applied to the packaged semiconductor device, and a third time with a third voltage being applied to the packaged semiconductor device, wherein the first voltage is lower than the second and third voltages and the second voltage is higher than the first and third voltages.

7. A packaged semiconductor device having testing steps comprising:
   generating memory repair data for a wafer die by writing at least one predetermined digital bit pattern into a memory on the wafer die, reading the at least one predetermined digital bit pattern back out of the memory, comparing the at least one predetermined digital bit pattern read out from the memory against the at least one predetermined digital bit pattern written into the memory, and storing results of the comparison as the memory repair data, wherein the writing and reading are performed a plurality of times, each time with a different voltage and clock frequency combination being applied to the wafer die;
   permanently programming the memory repair data into the wafer die;
   assembling the wafer die into the packaged semiconductor device; and
   testing the packaged semiconductor device by causing the memory repair data programmed within the packaged semiconductor device to be transferred into the memory a plurality of times, each time with a different voltage and clock frequency combination being applied to the packaged semiconductor device.

8. The packaged semiconductor device of claim 7, wherein the memory repair data is programmed into the wafer die by blowing one or more fuses on the wafer die corresponding to the memory repair data.

9. The packaged semiconductor device of claim 7, wherein the wafer die is assembled into the packaged semiconductor device by applying to the wafer die an exterior coating comprised of an epoxy material.

10. The packaged semiconductor device of claim 7, wherein the wafer die is assembled into the packaged semiconductor device by applying to the wafer die an exterior coating comprised of a ceramic material.

11. The packaged semiconductor device of claim 7, wherein during the step of generating the memory repair data, the writing and reading is performed three times, a first time with a first voltage being applied to the wafer die, a second time with a second voltage being applied to the wafer die, and a third time with a third voltage being applied to the wafer die, wherein the first voltage is lower than the second and third voltages and the second voltage is higher than the first and third voltages.

12. The packaged semiconductor device of claim 7, wherein during the step of testing the packaged semiconductor device, the memory repair data programmed within the packaged semiconductor device is transferred into the memory three times, a first time with a first voltage being applied to the packaged semiconductor device, a second time with a second voltage being applied to the packaged semiconductor device, and a third time with a third voltage being applied to the packaged semiconductor device, wherein the first voltage is lower than the second and third voltages and the second voltage is higher than the first and third voltages.

13. A method for testing semiconductor devices, comprising:
  generating memory repair data for a wafer die by writing at least one predetermined digital bit pattern into a memory on the wafer die, reading the at least one predetermined digital bit pattern back out of the memory, comparing the at least one predetermined digital bit pattern read out from the memory against the at least one predetermined digital bit pattern written into the memory, and storing results of the comparison as the memory repair data, wherein the writing and reading are performed a plurality of times, each time with a different voltage and clock frequency combination being applied to the wafer die;
  permanently programming the memory repair data into the wafer die;
  assembling the wafer die into a packaged semiconductor device;
  testing the packaged semiconductor device by causing the memory repair data programmed within the packaged semiconductor device to be transferred into the memory a first time with a first voltage and a first clock frequency being applied to the packaged semiconductor device; and
  testing the packaged semiconductor device by causing the memory repair data programmed within the packaged semiconductor device to be transferred into the memory a second time with either i) the first voltage and a second clock frequency being applied to the packaged semiconductor device or ii) a second voltage and the first clock frequency being applied to the packaged semiconductor device, wherein the first voltage and the second voltage are different voltages and wherein the first clock frequency and the second clock frequency are different frequencies.

14. The method of claim 13, wherein:
the first voltage is about 1.62 volts;
the second voltage is about 1.98 volts;
the first clock frequency is about 10 MHz; and
the second clock frequency is about 50 MHz.

15. The method of claim 13, wherein:
the method further comprises testing the packaged semiconductor device by causing the memory repair data programmed within the packaged semiconductor device to be transferred into the memory a third time with a third voltage and the second clock frequency being applied to the packaged semiconductor device; and
the step of testing the packaged semiconductor device a second time comprises testing the packaged semiconductor device with the second voltage and the first clock frequency being applied to the packaged semiconductor device, wherein the first voltage, the second voltage and the third voltage are different voltages.

16. The method of claim 15, wherein:
the first voltage is about 1.62 volts;
the second voltage is about 1.98 volts;
the third voltage is about 1.80 volts;
the first clock frequency is about 10 MHz; and
the second clock frequency is about 50 MHz.

17. The method of claim 13, wherein the step of generating memory repair data comprises:
  writing a first predetermined digital bit pattern into a memory on the wafer die with a fourth voltage and a third clock frequency applied to the wafer die;
  reading the first predetermined digital bit pattern back out of the memory;
  comparing the first predetermined digital bit pattern read out from the memory against the first predetermined digital bit pattern written into the memory;
  writing a second predetermined digital bit pattern into a memory on the wafer die with either i) the fourth voltage and a fourth clock frequency being applied to the wafer die or ii) a fifth voltage and the third clock frequency being applied to the wafer die, wherein the fourth voltage and the fifth voltage are different voltages and wherein the third frequency and the fourth frequency are different frequencies;
  reading the second predetermined digital bit pattern back out of the memory; and
  comparing the second predetermined digital bit pattern read out from the memory against the second predetermined digital bit pattern written into the memory.

18. The method of claim 17, wherein:
the step of generating memory repair data further comprises,
  writing a third predetermined digital bit pattern into a memory on the wafer die with a sixth voltage and the fourth clock frequency applied to the wafer die,
  reading the third predetermined digital bit pattern back out of the memory, and
  comparing the third predetermined digital bit pattern read out from the memory against the third predetermined digital bit pattern written into the memory; and
the step of writing a second predetermined digital bit pattern comprises writing the second predetermined digital bit pattern into the memory on the wafer die with the fifth voltage and the third clock frequency being applied to the wafer die, wherein the fourth voltage, the fifth voltage and the sixth voltage are different voltages.

* * * * *